United States Patent [19]

Wechsler

[11] 4,041,267
[45] Aug. 9, 1977

[54] MICROWAVE OVEN POWER CONTROL CIRCUIT

[75] Inventor: Reuben Wechsler, Phoenix, Ariz.

[73] Assignee: Motorola, Inc., Schaumburg

[21] Appl. No.: 608,813

[22] Filed: Aug. 28, 1975

[51] Int. Cl.² ............................................ H05B 9/06
[52] U.S. Cl. .............................. 219/10.55 B; 323/24
[58] Field of Search ............. 219/480, 10.55 B, 10.75; 323/22 SC, 24; 307/293

[56] References Cited

U.S. PATENT DOCUMENTS

| 3,780,252 | 12/1973 | Crapuchettes | 219/10.55 B |
| 3,862,390 | 1/1975 | Noda | 219/10.55 B |
| 3,943,317 | 3/1976 | Nagamoto | 219/10.55 B |

*Primary Examiner*—Robert J. Hickey

*Attorney, Agent, or Firm*—Michael D. Bingham

[57] ABSTRACT

An electronic triggering circuit is disclosed for developing a periodic control signal having a variable duty cycle. The periodic control signal is developed in synchronization with an applied alternating line voltage and is utilized for rendering a semiconductor switch conductive and nonconductive in timed relationship to the negative half cycle of the applied line voltage. The semiconductor switch is interposed between the line voltage and a load, which may be the power supply for a microwave oven, such that as the duty cycle of the control signal is varied the microwave power supplied to the oven is also varied. By rendering the semiconductor switch operative in timed relationship to the line voltage transients are minimized therethrough.

21 Claims, 6 Drawing Figures

FIG. 6

MICROWAVE OVEN POWER CONTROL CIRCUIT

BACKGROUND OF THE INVENTION

This invention relates to power control circuits suitable for varying the power supplied to an appropriate load and, more particularly to a solid state triggering circuit for a microwave oven power supply for varying the intensity of the microwave power.

Over the past several years, the microwave oven has become a familiar appliance. Many different types of ovens having varying functions associated therewith have been manufactured. A typical microwave oven and power supply circuit is illustrated in U.S. Pat. No. 3,780,252 to Crapuchettes et al. As brought out in this patent, all microwave ovens employ as a source of microwave energy, a microwave tube or "magnetron". The magnetron requires a high voltage power supply to generate microwave energy that includes a high voltage transformer to step up the line voltage carried to the homes of the consumer. As described in the subject patent, one such power supply circuit utilizes a high leakage reactance transformer and a voltage doubler circuit including a doubling capacitor. Briefly, by charging the doubling capacitor during a portion of the applied line voltage cycle, sufficient potential is developed during another portion of the applied line voltage cycle which causes the magnetron to be rendered conductive in timed relationship to the applied line voltage such that microwave energy is generated to cook food articles.

The subject patent is directed towards providing a phase control circuit for determining the proper phase at which current is supplied to the transformer whenever the oven is initially turned on. As disclosed, the current is synchronized with the applied line voltage in an attempt to reduce in-rush current transients. Therefore, during each desired cooking cycle (as set by a mechanical timer) the magnetron is rendered conductive in relation to to the applied line voltage until such time that the timer turns the oven off, which could be during any portion of the alternating cycle of the applied line voltage.

The Crapuchettes circuit has the disadvantage that during the complete time interval, as set by the timer, the magnetron conducts on alternating half cycles of the applied line voltage. Therefore, the net average power produced for heating food articles can not be varied in any particular cooking cycle period. However, it is desirable with many foods to set the cooking cycle for a definite time period and then adjust the average power produced by the microwave source so that more uniform cooking is obtained. Further, for example, to defrost foods it is necessary to have the microwave oven on for a relatively long period with the effective intensity of heat generated being nominal so that the food is not cooked at it is being thawed.

According to another prior art system, U.S. Pat. No. 3,862,390 to Noda, there is disclosed a circuit for varying the intensity of the microwave energy supplied by the energy source (a magnetron, for example). As brought out, the time period of the high frequency output energy from the magnetron can be varied to change the intensity of heating waves which are used to cook food articles. By varying the time period, more or less energy is supplied selectively so that energy of the proper intensity is derived in cooking different types of foods. For example, in the preparation of scrambled eggs, more uniform cooking is derived by reducing the time period at which microwave energy is produced during the cooking cycle. Further, it is not desired to defrost frozen foods at a high intensity as the frozen food article will not only be defrosted but also would be partially cooked if the microwave energy is not reduced during the time that the microwave oven is turned on.

The above described circuit as well as other prior art microwave ovens which include additional timer circuits for varying the effective intensity of the microwave energy have suffered in that audible clicks or "thumps" are emanated during the cooking cycle. It has been found that in addition to synchronously causing current to flow for deriving a voltage to produce the microwave energy that the current should be synchronously shut off with the applied line voltage. As will be discussed hereinafter, current surges into the high voltage transformer of the microwave frequency power supply can be eliminated thereby eliminating the above mentioned audible noise. Further, by reducing this current surge, semiconductor devices having smaller power ratings can be used thereby reducing component costs and hence, production costs which are directly passed to the consumer.

Thus, a need exists for a power control circuit for solving the above problems of transients and current surges. By elimination of such transients, a significant cost reduction in the manufacturing of microwave ovens is made possible.

SUMMARY OF THE INVENTION

Accordingly, it is an object of the present invention to provide a power control circuit for a power source which is suitable for varying the intensity of power supplied to a load.

Another object of the invention is to provide a power control circuit suitable for varying the intensity of power supplied by the power supply source of a microwave oven.

A further object of the invention is to provide a power control circuit suitable for initiating and terminating the power supplied to the high voltage power supply of a microwave oven during the negative half cycle of applied line voltage.

A still further object of the invention is to provide a power control circuit for a microwave oven wherein the duty cycle of the high frequency output device is made variable.

In accordance with the present invention, there is disclosed a power control circuit suitable for controlling the power supplied by a power source to a load wherein the initiation and termination of energizing current through the primary winding of the power source occurs in phased relationship to the negative half cycle of the applied alternating line voltage.

According to one feature of the invention there is provided a power control circuit suitable for controlling the power supplied by a power source to a load comprising: a converting circuit for converting applied alternating line power to power at a different frequency; a semiconductor switch interposed between the line power and the converting circuit, and a control circuit for operatively rendering the switch conductive and nonconductive to control the amount of power provided by the converter circuit to the load. The control circuit further includes timing means whereby the semiconductor switch is operatively controlled in predetermined timed relationship to the applied alternating line power frequency to minimize transients which would occur in the power control circuit.

DETAILED DESCRIPTION OF THE EMBODIMENT OF THE INVENTION

Figure 1:
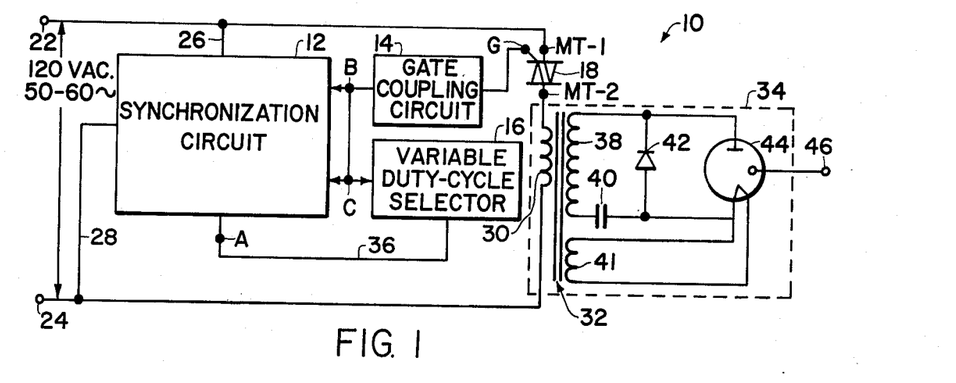
FIG. 1 is a block diagram of the power control circuit of the embodiment of present invention.

Referring to FIG. 1, there is illustrated power control circuit 10 of the present invention. For purposes of clarity, it is to be understood that conventional electrical and electromechanical components normally found within a complete microwave oven and which are not necessary to the operation of the understanding of the invention, have been omitted. Power control circuit 10 is illustrated as functionally including synchronization circuit 12, gate coupling circuit 14, variable duty cycle selector circuit 16, and semiconductor switch 18. Input terminals 22 and 24 are adapted to receive an alternating line voltage applied thereacross which, for example, is the typical 120 volt AC, 60 cycle line voltage carried to homes in the United States. Synchronization circuit 12 is coupled to input terminals 22 and 24 by leads 26 and 28 respectively. Semiconductor switch 18 is serially connected between input terminals 22 and 24 through primary winding 30 of voltage transformer 32 which comprises a portion of the load 34 which may be a microwave power supply for a microwave oven, for example. Gate coupling circuit 14 is operatively coupled between the gate of semiconductor switch 18 and one output of synchronization circuit 12, variable duty cycle selector circuit 16 is shown as being operatively coupled between another output of synchronization circuit 12 and to an input of the same over conductor 36. Voltage transformer 32, typically a high leakage reactance transformer having primary and secondary windings would side by side on a common core with preferably an iron shunt therebetween, further includes secondary winding 38 and an additional filament winding 41.

Load 34 further includes doubling capacitor 40 connected in series with blocking diode 42 across the secondary winding of transformer 32. The anode terminal of microwave tube 44 is coupled to the cathode of diode 42 and to a ground reference. The ends of filament winding 40 are connected across the heater cathode terminals of microwave tube 44. Microwave tube 44 which may be a magnetron is a conventional device which essentially converts electrical power of a first frequency supplied from a source of voltage into microwave frequency energy as is well understood in the art.

Briefly, if input terminal 22 is considered the common terminal, in response to the negative half cycle of the applied alternating line voltage, which is applied to terminal 24 a sync pulse is produced by synchronization circuit 12. If at the time the sync pulse is generated the magnitude of the voltage applied at terminal A from selector circuit 16 is greater with respect thereto, the output level of synchronization circuit 12 at terminals B and C will change states such that a control signal is applied to gate coupling circuit 14 which renders semiconductor switch 18 conductive. Simultaneously, variable duty cycle circuit selector 16 is rendered operative for discharging the voltage appearing at terminal A at a controlled rate. With semiconductor switch 18, which for example may be a triac, being rendered conductive current flows through primary winding 30 such that the voltage appearing at the dotted terminal of secondary winding 38 is positive and in much larger magnitude than the voltage developed across primary winding 30. Thus, diode 42 conducts and doubling capacitor 40 is fully charged up. As input terminal 24 becomes positive during the next half cycle, diode 42 is then rendered nonconductive and magnetron 44 generates energy over output transmission line 44, symbolically represented, to couple energy to the microwave oven cavity. As long as the voltage appearing at terminal A remains greater than a predetermined value, the output voltage level at terminals B and C remains in a low output state, as will be explained, and triac 18 remains in an operative condition and energizing current will be conducted therethrough. However, when the voltage appearing at terminal A decreases below the aforementioned predetermined value, the output level at terminals B and C will change to a relative high state such that the control signal through gate coupling circuit 14 is terminated. Simultaneously, variable duty cycle selector circuit 16 causes the voltage appearing at terminal A to begin to increase at a predetermined and constant ramp rate. In this condition of operation, triac 18 will continue to conduct until the beginning of the next positive half cycle of the applied line voltage at which time it is rendered nonconductive and no further microwave energy will be generated by magnetron 44. As will be explained hereinafter, the rate at which the voltage appearing at terminal A is caused to increase and decrease may be made variable such that the duty cycle of the microwave energy generated by magnetron 44 may be varied from zero to 100 percent which thereby either increases or decreases the intensity of the microwave energy produced.

Figure 2:
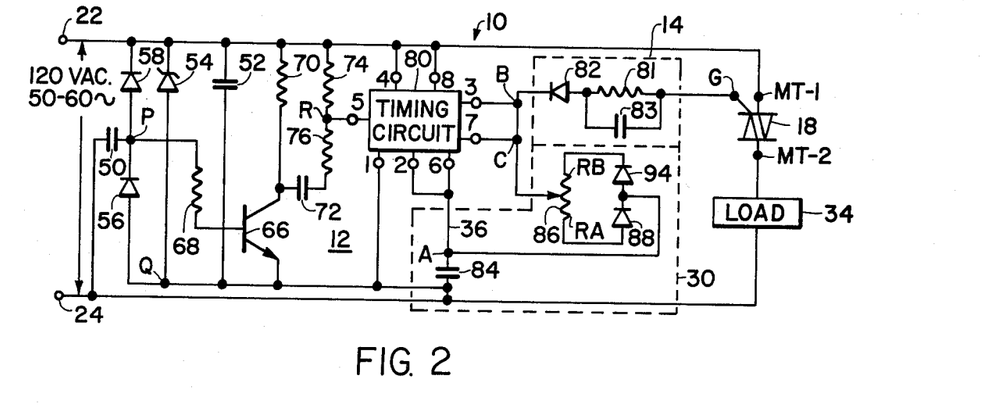
FIG. 2 is a partial block and schematic diagram of one embodiment of the invention.
Figure 3:
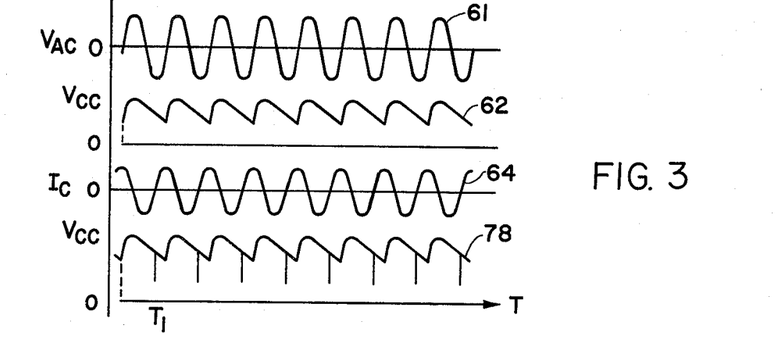
FIG. 3 illustrates waveforms useful in understanding the operation of the embodiment of FIG. 2.
Figure 4:
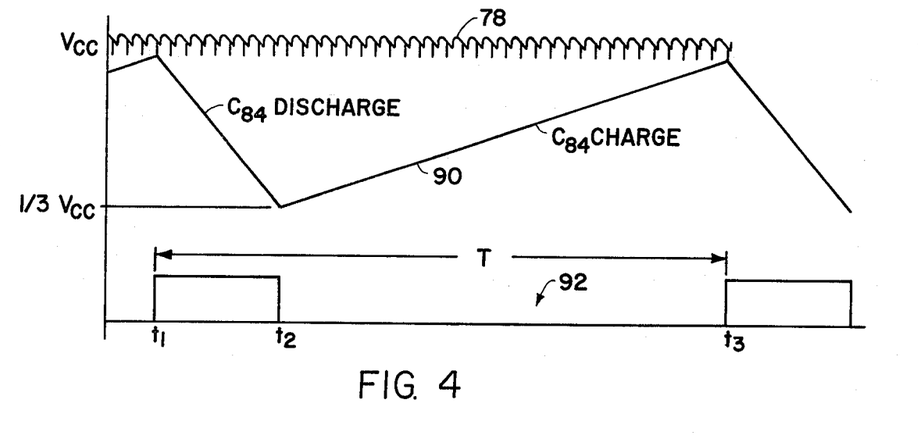
FIG. 4 illustrates additional waveforms useful in understanding the operation of the embodiment of FIG. 2.

Referring now to FIGS. 2, 3 and 4, various portions of the detailed schematic diagram and waveforms depicted therein are provided with the reference numbers which correspond to the circuit functions of FIG. 1 to facilitate correlation between the circuits of FIG. 2 and FIG. 1.

Synchronization circuit 12 includes an internal power supply and sync pulse circuitry interrelated with each other. The internal power supply circuit includes capacitor 50, capacitor 52, zener diode 54, and rectifying diodes 56 and 58. Capacitor 50 is a capacitive ballast which provides for a reactive voltage dropping thereacross. When the alternating line voltage is applied to phase control circuit 10 at input terminals 22 and 24, during the negative half cycle (node P being negative with respect to the input terminal 22) diode 56 conducts such that capacitor 52 and capacitor 50 are charged. Because capacitor 52 and 50 comprise a capacitor voltage divider network, the voltage developed across capacitor 52 reaches a magnitude, $V_{CC}$, to operate timing circuit 80. The remainder of the magnitude of the applied line voltage is dropped across capacitor 50. The maximum voltage which is developed across capacitor 52 is limited by zener diode 54 which is connected thereacross. The value of capacitor 52 is chosen so that at maximum load condition (triac 18 being rendered conductive) the ripple of the voltage developed across capacitor 52 is made quite large, for example, 50%, as illustrated by waveform 62 of FIG. 3. As diode 56 conducts current for charging of capacitors 52 and 50, the current through capacitor 50 leads the applied alternating line voltage by nearly 90 degrees. Therefore, as illustrated by waveform 64, current zero crossing through capacitor 50 occurs at substantially the peak of the negative half cycle of the applied alternating line voltage (waveform 61). Therefore, when the current through capacitor 50 approaches zero crossing in a positive going direction, at time $T_1$, node P becomes positive with respect to node Q.

With node P positive with respect to node Q, transistor 66 is rendered conductive and base drive current is applied through resistor 68 which is connected between the base of transistor 66 and node P. Transistor 66, having its collector and emitter electrodes connected respectively to input terminal 22 through resistor 70 and node Q, is driven hard "on", into a saturated condition. Current is momentarily conducted through capacitor 72 and the voltage divider network including resistors 74 and 76 such that the voltage which is developed across resistor 76 at node R is momentarily decreased to produce a sync pulse as illustrated in waveform 78 at time $T_1$. The value of resistors 74 and 76 are chosen in conjunction with the value for capacitor 72 such that the time constant of the circuit can be made quite small such that the sync pulse appears as a transient spike after which capacitor 72 becomes fully charged thereby inhibiting any further current through the voltage divider network. Thus, a sync pulse is produced substantially at the peak of the negative half cycle of the alternating line voltage which may be, for example, occurring at a 60 hertz rate.

Synchronization circuit 12 is illustrated as further including a monolithic integrated timing circuit 80 which, for example, may be a Motorola MC1455 timing circuit which has been modified to bring the output of the internal threshold comparator (pin 5) directly to an outside terminal and is connected to node R between resistor 74 and 76. With monolithic integrated timing circuit 80 connected in a monostable mode, as long as the voltage applied to pin 5 is greater than the voltage applied to pin 6, pins 3 and 7 which are coupled to gate coupling circuit 14 and variable duty cycle selector circuit 16 are at a "high" state. With pins 3 and 7 being "high", diode 82 is reverse biased such that triac 18 is rendered nonconductive. With triac 18 being in a nonconductive state, energizing current is prohibited from being conducted through load 34 and no microwave energy is supplied thereby.

If it is assumed that each time the alternating line voltage is applied to input terminals 22 and 24 of power control circuit 10 (when turning the microwave oven on) that capacitor 84 is in an uncharged state, the voltage applied to pin 5 will be initially greater than the voltage applied to pin 6. Therefore, as previously discussed, pin 3 will be in a high state and current will be sourced from pin 3 through potentiometer 86, diode 88 through capacitor 84 which then begins to be charged. The slope at which capacitor 84 ramps upward is determined by the lower resistance portion of potentiometer 86, resistance $R_A$, and the value of capacitor 84. Capacitor 84 continues to be charged, as illustrated in FIG. 4, until time $T_1$ at which the magnitude of the voltage developed thereacross and which is applied to pins 6 and 2 of timing circuit 80 becomes greater than the voltage applied to pin 5 thereof. As illustrated, the magnitude of the voltage applied to pin 6 becomes greater than the voltage applied to pin 5 during occurrence of the generated sync pulse, which is during the negative half cycle of the applied line voltage (waveform 90). Thus, at time $T_1$ the output of timing circuit 80 (pins 3 and 7) are switched to a "low" output state. Triac 18 is then rendered conductive with gate current flowing from the main terminal (MT-1) thereof through the gate, and through gate coupling circuit 14 to pins 3 and 7 of timing circuit 80. Current is also conducted through triac 18 through primary winding 30. As long as pins 3 and 7 are in a "low" state, triac 18 will remain conductive as shown by waveform 92 between time $T_1$ and $T_2$. With pins 3 and 7 sinking current, capacitor 84 is then discharged through diode 94 and resistance, $R_B$ of potentiometer 86. The slop at which capacitor 86 ramps downward is most nearly determined by the value of $R_B$ and the value of capacitor 84. Capacitor 84 will continue to discharge until such time that the magnitude of the voltage thereacross becomes equal to or less than one-third $V_{CC}$. At this time, with pin 2 being at one-third $V_{CC}$, timing circuit 80 is caused to switch states with pins 3 and 7 going to a "high" output level state once again. Therefore, at time $T_2$ capacitor 84 is once again charged as previously discussed and triac 18 will be rendered nonconductive as the applied alternating line voltage crosses through a zero reference. Triac 18 remains nonconductive during the time interval $T_2$ through $T_3$ until the voltage magnitude across capacitor 84 once again exceeds the voltage applied at pin 5. By varying the position of the potentiometer wiper arm to either decrease or increase $R_A$, the precent of time that triac 18 is rendered conductive can be varied such that the current conduction duty cycle may be varied from substantially zero to 100 percent of the time period, T, which is equal to $T_1-T_3$. However, because only the ratio between $R_A$ and $R_B$ is varied and not the total resistance of the potentiometer, the total time period required for charging and discharging capacitor 84 and thus the overall time that triac 18 is rendered nonconductive and conductive remains substantially constant. Due to the phase shift through capacitor 50 and the large ripple of $V_{CC}$, the voltage at pin 2 will drop below one third $V_{CC}$ during the negative half-cycle of the line voltage to ensure that energizing current through primary winding 30 ceases as the line voltage starts positive. Thus triac 18 is rendered nonconductive immediately after doubler capacitor 40 has been charged.

The high frequency output from magnetron 44 can be controlled by varying the ON and OFF times of triac 18 by power control circuit 10. By varying the respective resistances of $R_A$ and $R_B$, by moving the wiper arm of potentiometer 86, the duty cycle of triac 18 is varied, for example, by decreasing $R_A$, capacitor 84 is charged to the voltage required to cause switching of timer circuit 80 sooner such that the time interval from $T_2-T_3$ is foreshortened. However the time that it takes to discharge the capacitor, $T_1-T_2$ will be lengthened accordingly as $R_B$ has been increased. Thus, the time that triac 18 is on is a greater portion of the total time T even though this time interval remains constant. Thus, the total number of cycles that magnetron 44 conducts during the interval $T_1-T_2$ is greater which increases the net average power supplied by magnetron 44, the reverse holds if $R_A$ should be increased.

Although power control circuit 10 may be used directly in controlling the intensity of microwave energy developed for heating food articles, a timer is customarily utilized in conjunction with the present invention to control the operating time of the microwave oven. Thus, the present invention provides for varying the effective intensity of the microwave power supplied during a predetermined cooking cycle which allows for more uniform cooking of delicate food articles such as scrambled eggs, for instance. Further, by proper adjustment of the duty cycle of the power control circuit, adjusting the aforedescribed potentiometer, frozen foods can be properly defrosted. Moreover, the power control circuit of the invention eliminates or severly limits undesirable transients from being produced during repetitive turn ON and OFF of the semiconductor switch to protect circuit components and to eliminate audible clicks or "thumps" from being emanated.

The above described power control circuit has been built and successfully tested. By way of example only, the following values were used for the components of FIG. 2:

| | |
|---|---|
| Diodes 56, 58, 82 | IN4001 |
| Diodes 88, 94 | MSD 7000 (Dual Diode) |
| Transistor 66 | MPS A20 |
| Triac 18 | Zn6346A |
| Zener Diode 54 | IN5240 |
| Timer Circuit 80 | MC 1455 (Modified) |
| Resistor 68 | 1,000 Ohms |
| Resistor 70 | 10,000 Ohms |
| Resistor 74 | 1,000 Ohms |
| Resistor 76 | 2,000 Ohms |
| Potentiometer 86 | 1,000,000 Ohms |
| Capacitor 50 | 3 Microfarads, 130 vac |
| Capacitor 52 | 100 Microfarads |
| Capacitor 72 | .05 Microfarads |
| Capacitor 83 | 1 Microfarads |
| Capacitor 84 | 1 Microfarads |

Figure 5:
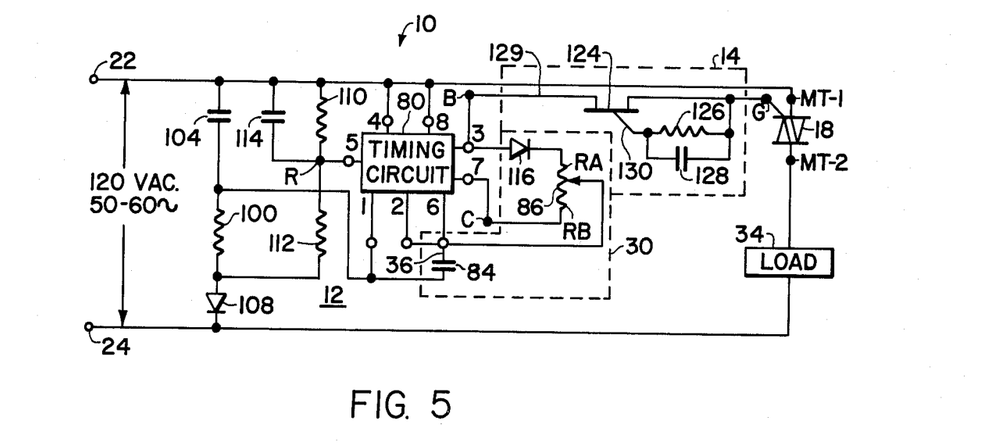
FIG. 5 is a partial schematic diagram of another embodiment of the invention.
Figure 6:
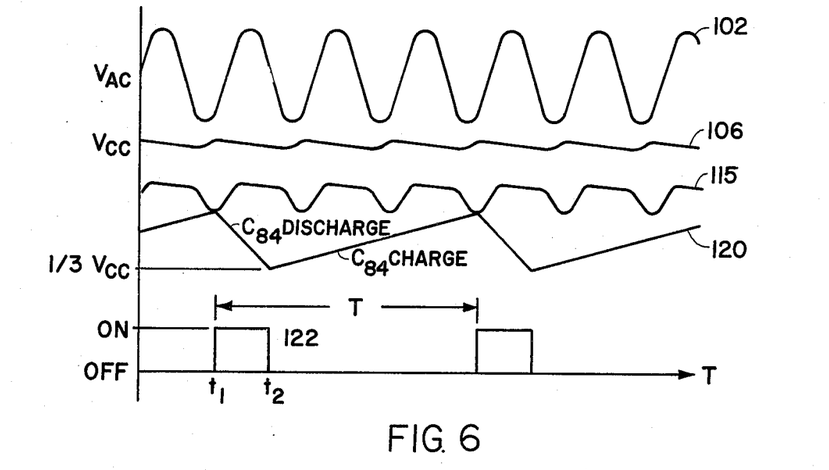
FIG. 6 illustrates waveforms useful in understanding the operation of the embodiment of FIG. 5.

Referring now to FIGS. 5 and 6, there is shown a power control circuit of another embodiment of the invention. The same reference numbers are used for components corresponding to like components of FIG. 2.

To optimize the performance of triac 18, it is necessary to drive the gate of the device with several times the required minimum current. This imposes a stringent requirement on the internal power supply of power control circuit 10, which in FIG. 2 comprises; compacitor 50, diodes 56 and 58, zener diode 54 and capacitor 52. More specifically, the internal power supply requires a relatively large value of capacitor 50 for reactively dropping the applied alternating line voltage thereacross. Therefore, if high peak gate current is provided which has a relatively low average current, a reduction in size of capacitor 50 or even elimination thereof, can be provided for even further reducing the production and fabrication cost of power control circuit 10. Whereas, gate coupling circuit 14 of the circuit of FIG. 2 continually draws peak gate current during the ON time of triac 18, between time interval $T_1$-$T_2$, gate coupling circuit 14 of the embodiment of FIG. 5 comprises an oscillator circuit (as will be hereinafter described) which provides for high peak gate current having a very short duty cycle to reduce the average current drawn through the triac. Because triac 18 is pulsed on and off in a low duty cycle, the internal power supply of power control circuit 10 has a much less stringent current requirement. In fact, by pulsing triac 18, the average gate current of the embodiment of FIG. 5 may be on the order of eight-ten milliamperes instead of an average current of 50 milliamperes drawn through the gate as produced by the embodiment of FIG. 2. As such, it becomes very practical to employ dropping resistor 100 in place of the capacitor ballast as employed in the circuit of FIG. 2. However, with the elimination of the ballast capacitor in the power supply, the 90 degree phase shift utilized in the generation of the sync pulse is no longer available and must be accomplished in another manner as will be described.

In response to the negative half cycle of the alternating applied line voltage to input terminals 22 and 24, waveforms 102 of FIG. 6, capacitor 104 is charged to a voltage magnitude shown as $V_{CC}$, waveform 106, through dropping resistor 100, and diode 108. Simultaneously, during the negative half cycle of the alternating line voltage, current flows through the resistive divider network comprising resistors 110 and 112 such that the voltage appearing at node R follows the negative half cycle of the applied line voltage (being divided down by the ratio of the two resistors of the voltage divider network as is known). Capacitor 114 is selected of the correct value with respect to the value of the resistors of voltage divider network such that a slight lag in the peak of the voltage appearing at node R occurs. The lag in the voltage appearing at pin 5 of timing circuit 80 is predetermined so that the sync pulse developed thereat occurs during the optimum portion of the negative half cycle of the applied alternating line voltage, time $T_1$ (FIG. 6).

Assuming that power control circuit 10 has been turned on with the alternating line voltage being applied at a 60 hertz rate, capacitor 84 will be continually charged and discharged in a similar manner as previously discussed for the circuit of FIG. 2. Briefly, with a voltage applied to pin 5 of timing circuit 80 being greater than the magnitude of the voltage developed across capacitor 84 and therefor to pin 6 of timing circuit 80, the output of timing circuit 80 at pins 3 and 7 is at a "high" output level state such that current is sourced out of the IC through diode 116, the upper portion, $R_A$, of potentiometer 86 through capacitor 84, thereby charging capacitor 84 at a constant slope which is a function of the time constant produced by resistance $R_A$ and the capacitor, waveform 120, between time intervals $T_0$-$T_1$. At time, $T_1$, the magnitude of the voltage developed across capacitor 84, and to pin 6, becomes substantially equal to or greater than the voltage at pin 5 such that the respective outputs of timing circuit 80 are switched to a "low" output level state and capacitor 84 begins to be discharged at a constant slope through resistance $R_B$ of potentiometer 86, through pin 7 which is a current sink internal to timing circuit 80 between times, $T_1$ and $T_2$. As previously discussed, the time period between discharging and charging of capacitor 84, time T, will remain substantially constant but the duty cycle thereof can be varied by increasing or decreasing either of the resistances of potentiometer 86 by moving of the potentiometer wiper arm. Thus, the duty cycle of the current supplied through triac 18 may be varied such that the intensity of the microwave energy generated by magnetron 44 may be varied during the cooking cycle.

If, during time interval $T_1$-$T_2$, when energizing current flows through the primary winding of the transformer of load 34, the gate current can be turned on and off at a substantial higher rate than the period of the applied alternating line voltage, triac 18 will remain conductive during the predetermined time interval at which capacitor 84 is being discharged. Therefore, the gate current is pulsed off and on at a high repetition rate by using an oscillator circuit comprising unijunction transistor 124, resistor 126 and capacitor 128.

During the cooking cycle when capacitor 84 is being charged, the output level state at pin 3 of timing circuit 80 is "high" and inijunction transistor 124 is rendered nonconductive. In response to the output at pin 3 going "low" unijunction transistor 124 will be turned on hard by the surge current through capacitor 128 for a predetermined time which is determined by the time constant between capacitor 128 and the effective internal on-state resistance of unijunction transistor 124 between its emitter 130 and first base electrode 129, thereby sinking current from the gate of triac 18 through the transistor and pin 3 of timing circuit 80. For example, unijunction transistor 124 can be rendered conductive and nonconductive at a 10 kilohertz rate such that even though high peak gate current is conducted therethrough, the average of the current can be minimized. Thus, triac 18 is rendered conductive until capacitor 84 is discharged to one third $V_{CC}$ whereby this voltage, which is applied to pin 2 of timing circuit 80, causes the output to switch states thereby rendering triac 18 nonconductive at such time that the applied line voltage crosses the zero reference axis.

The power control circuit of FIG. 5 has been fabricated ans successfully tested wherein the duty cycle of the power supplied to load 34 is made variable from substantially 0–100 percent of the cooking cycle. The following values for the phase control circuit of FIg. 5 are listed below. The values for the components are for information purposes only and are not meant to limit the scope of the invention in any manner.

| | |
|---|---|
| Diode 108 | IN4003 |
| Diode 116 | IN4001 |
| Timing Circuit 80 | MC 1455 (Modified) |
| Triac 18 | MU 20 |
| Unijunction Transistor 124 | 2N6346A |
| Resistor 100 | 5,600 Ohms |
| Resistor 110 | 10,000 Ohms |
| Resistor 112 | 390,000 Ohms |
| Resistor 126 | 3,300 Ohms |
| Potentiometer 86 | 1,000,000 Ohms |
| Capacitor 104 | 100 Microfarads |
| Capacitor 114 | .1 Microfarads |
| Capacitor 84 | 2 Microfarads |
| Capacitor 124 | .02 Microfarads |

Thus, what has been described are improved phase control circuits for a microwave oven for eliminating or severely reducing transients when turning on and off the high voltage power supply to the microwave oven. With the reduction of current and voltage transients, the aforedescribed circuits minimize electrical stress on the current carrying components of the phase power control circuit. Moreover, audible noise is reduced to a minimum.

What is claimed is:

1. A power control circuit suitable for controlling the power supplied by a power source to a load operatively coupled to the power source, comprising in combination:

means for converting an alternating line power supply to power at a different frequency;

switching means operatively interposed between the alternating line power supply and said converting means; and means for controlling the switching operation of said switching means to control the intensity of the power provided by said converting means, said controlling means including synchronization circuit means responsive to the alternating line power supply for producing a sync pulse in timed relationship to each successive negative half cycle of the alternating line power suppy for rendering said switching means conductive and nonconductive in a predetermined timed relationship to the alternating line power supply frequency to minimize transients in the power control circuit.

2. The power control circuit of claim 1 wherein said converting means includes:

a magnetron for generating microwave energy;

a transformer having primary and secondary windings, said primary windings being serially coupled between said switching means and the alternating line power supply; and rectifying means coupled to said secondary winding and said magnetron for rectifying said alternating line power supply to direct voltage which is applied to said magnetron.

3. The power control circuit of claim 1 wherein said switching means includes a semiconductor switch having first and second main electrodes and a control electrode, said first main electrode being coupled to the alternating line power supply, said second main electrode being coupled to said converting means and said control electrode being coupled to said controlling means.

4. The power control circuit of claim 3 wherein said controlling means further includes:

said synchronization circuit means including timing means having first and second output level states, the time interval at which said timing means is in said second output level state having a predetermined duration;

first circuit means interposed between said timing means and said control electrode of said semiconductor switch means and being responsive to said timing means being in said second output level state such that said semiconductor switch is rendered conductive and being responsive to said timing means being in said first output level state such that said semiconductor switch is rendered nonconductive;

means operatively coupled to said synchronization circuit means for developing a periodic reference signal having first and second portions and including means for varying the time interval of said first and second portions, the total time interval of each periodic reference signal being substantially constant, said first portion being produced during the time interval said timing means is in said first output level state until the magnitude of said first portion becomes substantially equal to the magnitude of said sync pulse which causes said timing means to switch output states, said second portion being produced in response to said second output level state until the magnitude of said second portion reaches a predetermined value which causes the output of said timing means to switch to said first output level state; and said converting means being responsive to the time duration that said timing means is in said second output level state to provide said power at a different frequency, the net power provided by said converting means being varied with respect to the ratio of the time interval said timing means is in said second output level state to said total time interval.

5. The power control circuit of claim 4 wherein said synchronization circuit means includes:
a ballast capacitor having first and second terminals, said first terminal being coupled to one side of the applied alternating line power supply;
a first diode having the anode coupled to the second terminal of said ballast capacitor and the cathode coupled to the other side of the alternating line power supply;
a second diode having the cathode coupled to said second terminal of said ballast capacitor;
a first capacitor having first and second terminals, said first terminal being coupled to the anode of said second diode, said second terminal being coupled to said cathode of said first diode;
electron control means having first, second and control electrodes, said first electrode being coupled to said anode of said second diode, said second electrode being coupled to said cathode of said first diode, said control electrode being coupled to said second terminal of said ballast capacitor;
a second capacitor having first and second terminals, said first terminal being connected to said second electrode of said electron control means; and
resistive divider means coupled between said other side of the alternating line power supply and said second terminal of said second capacitor and including an output terminal coupled to said timing means.

6. The power control circuit of claim 5 wherein said means for developing a periodic reference signal includes:
a third capacitor having first and second terminals, said first terminal being coupled to said anode of said second diode of said synchronization circuit means, said second terminal being coupled to said timing means;
potentiometer means having the wiper arm thereof coupled to said timing means;
serially coupled diodes coupled across said potentiometer means and having an output between the same; and
second circuit means coupling said output of said serially coupled diodes to said second terminal of said third capacitor.

7. The power control circuit of claim 4 wherein said synchronization circuit means includes:
first capacitive means having first and second terminals, said first terminal being coupled to one side of the alternating line power supply and said second terminal being operatively coupled to said timing means;
circuit means coupled between said second terminal of said first capacitive means and the other side of said alternating line power supply;
second capacitive means having first and second terminals, said first terminal being coupled to said one side of the alternating line power supply; and
resistive divider means coupled between said alternating line power supply and having an output terminal coupled to said second terminal of said second capacitive means and to said timing means.

8. The power control circuit of claim 7 wherein said means for developing a periodic reference signal includes:
third capacitive means having first and second terminals operatively coupled between said timing means and said second terminal of said first capacitive means respectively; and
potentiometer means operatively coupled between said timing means and having the wiper arm thereof coupled to said first terminal of said third capacitive means.

9. The power control circuit of claim 8 wherein said first circuit means comprise oscillator means for switching said semiconductor switch means on and off at a predetermined repetition rate in response to said timing means being in said second output level state.

10. The power control circuit of claim 9 wherein said oscillator means includes:
a unijunction transistor having first, second and control electrode, said first electrode being coupled to said timing means, said second electrode being coupled to said control electrode of said semiconductor switch;
a resistor coupled between said control electrode and said second electrode of said unijunction transistor; and
a capacitor coupled between said control electrode and said second electrode of said unijunction transistor.

11. A power control circuit suitable for controlling the power supplied by a suource of microwave energy in a microwave oven, comprising in combination:
means for converting an alternating line power supply to microwave power;
switching means operatively interposed between said converting means and the alternating line power supply; and
means for controlling the switching operation of said switching means, said controlling means including synchronization circuit means responsive to the alternating line power supply for producing a sync pulse in timed relationship to each successive negative half cycle of the alternating line power supply for rendering said switching means conductive and nonconductive in a predetermined timed relationship to the alternating line power supply frequency to minimize transients in the power control circuit.

12. The power control circuit of claim 11 wherein said converting means includes:
a magnetron for generating microwave energy;
a transformer having a primary and secondary windings, said primary windings being serially coupled between said switching means and the alternating line power supply; and
rectifying means coupled to said secondary winding and said magnetron for rectifying said alternating line power supply to direct voltage which is applied to said magnetron.

13. The power control circuit of claim 11 wherein said switching means includes a semiconductor switch having first and second main electrodes and a control electrode, said first main electrode being coupled to the alternating line power supply, said second main electrode being coupled to said converting means and said control electrode being coupled to said controlling means.

14. The power control circuit of claim 13 wherein said controlling means further includes:
said synchronization circuit means including timing means having first and second output level states, the time interval at which said timing means is in said second output level state having a predetermined duration;

first circuit means interposed between said timing means and said control electrode of said semiconductor switch means and being responsive to said timing means being in said second output level state such that said semiconductor switch is rendered conductive and being responsive to said timing means being in said first output level state said semiconductor switch is rendered nonconductive;

means operatively coupled to said synchronization circuit means for developing a periodic reference signal having first and second portions and including means for varying the time interval of said first and second portions, the total time interval of each periodic reference signal being substantially constant, said first portion being produced during the time interval said timing means is in said first output level state until the magnitude of said first portion becomes substantially equal to the magnitude of said sync pulse which causes said timing means to switch output states, said second portion being produced in response to said second output level state until the magnitude of said second portion reaches a predetermined value which causes the output of said timing means to switch to said first output level state; and said converting means being responsive to the time duration that said timing means is in said second output level state to provide said power at a different frequency, the net power provided by said converting means being varied with respect to the ratio of the time interval said timing means is in said second output level state to said total time interval.

15. The power control circuit of claim 14 wherein said synchronization circuit means includes:
   a ballast capacitor having first and second terminals, said first terminal being coupled to one side of the applied alternating line power supply;
   a first diode having the anode coupled to the second terminal of said ballast capacitor and the cathode coupled to the other side of the alternating line power supply;
   a second diode having the cathode coupled to said second terminal of said ballast capacitor;
   a first capacitor having first and second terminals, said first terminal being coupled to the anode of said second diode, said second terminal being coupled to said cathode of said first diode;
   electron control means having first, second and control electrodes, said first electrode being coupled to said anode of said second diode, said second electrode being coupled to said cathode of said first diode, said control electrode being coupled to said second terminal of said ballast capacitor;
   a second capacitor having first and second terminals, said first terminal being connected to said second electrode of said electron control means; and
   resistive divider means coupled between said other side of the alternating line power supply and said second terminal of said second capacitor and including an output terminal coupled to said timing means.

16. The power control circuit of claim 15 wherein said means for developing a periodic reference signal includes:
   a third capacitor having first and second terminals, said first terminal being coupled to said anode of said second diode of said synchronization circuit means, said second terminal being coupled to said timing means;
   potentiometer means having the wiper arm thereof coupled to said timing means;
   serially coupled diodes coupled across said potentiometer means and having an output between the same; and
   second circuit means coupling said output of said serially coupled diodes to said second terminal of said third capacitor.

17. The power control circuit of claim 14 wherein said synchronization circuit means includes:
   first capacitive means having first and second terminals, said first terminal being coupled to one side of the alternating line power supply and said second terminal being operatively coupled to said timing means;
   circuit means coupled between said second terminal of said first capacitive means and the other side of said alternating line power supply;
   second capacitive means having first and second terminals said first terminal being coupled to said one side of the alternating line power supply; and
   resistive divider means coupled between said alternating line power supply and having an output terminal coupled to said second terminal of said second capacitive means and said timing means.

18. The power control circuit of claim 17 wherein said means for developing a periodic reference signal includes:
   third capacitive means having first and second terminals operatively coupled between said timing means and said second terminal of said first capacitive means respectively; and
   potentiometer means operatively coupled between said timing means and having the wiper arm thereof coupled to said first terminal of said third capacitive means.

19. The power control circuit of claim 18 wherein said first circuit means comprises oscillator means for switching said semiconductor switch means on and off at a predetermined repetition rate in response to said timing means being in said second output level state.

20. The power control circuit of claim 19 wherein said oscillator means includes:
   a unijunction transistor having first, second and control electrode, said first electrode being coupled to said timing means, said second electrode being coupled to said control electrode of said semiconductor switch;
   a resistor coupled between said control electrode and said second electrode of said unijunction transistor; and
   a capacitor coupled between said control electrode and said second electrode of said unijunction transistor.

21. In a power control circuit a method for controlling the intensity of microwave energy supplied to a microwave oven, comprising the steps of:
   generating a sync pulse in timed relationship to an applied alternating line power supply;
   developing a reference signal having a first and second portion, the magnitude of the first portion increasing at a first controlled rate and the magnitude of the second portion decreasing at a second controlled rate;

developing a gate pulse signal during the duration of the second portion of said reference signal;

switching a semiconductor switch on in response to said gate pulse signal in timed relationship to said sync pulse;

switching said semiconductor switch off in timed relationship to the applied line power supply; and developing the microwave energy during the time duration which said semiconductor switch is on.

* * * * *